(12) United States Patent
Doddamane et al.

(10) Patent No.: US 7,945,823 B2
(45) Date of Patent: May 17, 2011

(54) PROGRAMMABLE ADDRESS SPACE BUILT-IN SELF TEST (BIST) DEVICE AND METHOD FOR FAULT DETECTION

(75) Inventors: Ramesha Doddamane, Hyderabad (IN); Eswar Vadlamani, Hyderabad (IN); Gopalakrishnan Perur Krishnan, Bangalore (IN); Tarjinder Singh, Bangalore (IN)

(73) Assignee: Netlogic Microsystems, Inc., Santa Clara, CA (US)

( * ) Notice: Subject to any disclaimer, the term of this patent is extended or adjusted under 35 U.S.C. 154(b) by 968 days.

(21) Appl. No.: 11/713,258

(22) Filed: Mar. 2, 2007

(65) Prior Publication Data

US 2007/0271482 A1  Nov. 22, 2007

Related U.S. Application Data

(60) Provisional application No. 60/779,151, filed on Mar. 2, 2006.

(51) Int. Cl.
*G11C 29/00* (2006.01)

(52) U.S. Cl. .......................................... 714/718; 714/30

(58) Field of Classification Search ................. 365/49.1, 365/49, 201; 714/718, 711, 733, 8, 719, 714/724, 25, 30
See application file for complete search history.

(56) References Cited

U.S. PATENT DOCUMENTS

| | | | |
|---|---|---|---|
| 5,289,403 A | | 2/1994 | Yetter |
| 5,936,900 A * | | 8/1999 | Hii et al. ........................ 365/201 |
| 6,286,116 B1 | | 9/2001 | Bhavsar |
| 6,505,313 B1 * | | 1/2003 | Phan et al. ..................... 714/718 |
| 6,550,034 B1 | | 4/2003 | Riedlinger et al. |
| 6,609,222 B1 | | 8/2003 | Gupta et al. |
| 6,728,910 B1 * | | 4/2004 | Huang ........................... 714/711 |
| 6,769,081 B1 * | | 7/2004 | Parulkar ........................ 714/733 |
| 6,839,259 B2 * | | 1/2005 | Tsuda ........................... 365/49.1 |
| 6,870,749 B1 | | 3/2005 | Park et al. ........................ 365/49 |
| 6,966,017 B2 | | 11/2005 | Evans |
| 6,987,684 B1 | | 1/2006 | Branth et al. .................... 365/49 |
| 7,130,230 B2 | | 10/2006 | Jain et al. |
| 7,193,876 B1 | | 3/2007 | Park et al. ........................ 365/49 |
| 7,304,875 B1 | | 12/2007 | Lien et al. ........................ 365/49 |
| 7,389,458 B2 * | | 6/2008 | Bacigalupo .................... 714/733 |
| 7,434,131 B2 * | | 10/2008 | Mukherjee et al. ............ 714/733 |
| 2004/0059974 A1 * | | 3/2004 | Nicolaidis ...................... 714/724 |
| 2005/0081093 A1 * | | 4/2005 | Joly et al. .......................... 714/8 |
| 2005/0240817 A1 * | | 10/2005 | Bair et al. ......................... 714/25 |
| 2006/0146622 A1 * | | 7/2006 | Mukherjee et al. ............ 365/201 |
| 2006/0156134 A1 * | | 7/2006 | Mukherjee et al. ............ 714/733 |
| 2006/0215432 A1 * | | 9/2006 | Wickeraad et al. .............. 365/49 |

OTHER PUBLICATIONS

U.S. Appl. No. 10/876,864, not published, Maheshwari et al.
U.S. Appl. No. 11/429,129, not published, Krishnan et al.

* cited by examiner

*Primary Examiner* — David Ton
(74) *Attorney, Agent, or Firm* — Haverstock & Owens, LLP

(57) ABSTRACT

A built-in self-test (BIST) circuit for testing addressable locations can include a BIST generator (202) that can generate test addresses for testing each addressable location. Defective addresses can be stored in a fault address store (216). An address range selector circuit (230) can limit the range of addresses generated by an address generator (234). Once defective addresses for a first range have been detected, an address range selector circuit (230) can test another range. An entire address range can thus be tested regardless of the depth of a fault address store (216).

17 Claims, 6 Drawing Sheets

PROGRAMMABLE ADDRESS SPACE BUILT-IN SELF TEST (BIST) DEVICE AND METHOD FOR FAULT DETECTION

This application claims the benefit of U.S. Provisional Patent Application, Ser. No. 60/779,151, filed on Mar. 2, 2006, the contents of which are incorporated by reference herein.

TECHNICAL FIELD

The present invention relates generally to the testing of integrated circuit devices, and more particularly to integrated circuits having a built-in self-test (BIST) capability.

BACKGROUND OF THE INVENTION

The testing of integrated circuits can occur throughout the life of a device. An integrated circuit may be tested in die form, while still part of a wafer, in packaged form at the "back" end of a manufacturing process, and/or after the device has been incorporated into a system ("in system" testing).

In order to reduce overall integrated circuit (i.e., chip) test costs, some chips are fabricated with built-in self-test (BIST) circuitry. Such circuitry is considered "built-in" as it is included on the chip itself or as part of a package containing the chip. This can allow for internally generated test patterns to be applied to a portion of the chip. BIST capabilities can increase the speed at which a device is tested, as an integrated circuit can typically operate at a faster speed than a tester (i.e., automatic test equipment, ATE).

In memory devices, including content addressable memory (CAM) devices, it is desirable to self-test each storage location to determine whether or not it is operating properly. CAM devices can have large numbers of entries, each of which includes a number of CAM cells that are typically more complex than other types of memory cells, as they can include built-in compare circuitry. Thus, the ability to test such addressable locations can significantly reduce overall manufacturing costs.

To better understand the various features of the embodiments disclosed below, conventional BIST approaches will now be described in more detail.

A conventional BIST arrangement is shown In FIG. 4 and designated by the general reference character 400. A BIST arrangement 400 can include a tested section 402 that can provide some predetermined function and a BIST section 404 that can test various functions of the tested section 402. In the particular example of FIG. 4, a BIST arrangement 400 shows a tested section 402 that includes a content addressable memory (CAM) array 405, control logic 406, and a test MUX 408. In a non-test mode, test MUX 408 can couple input data by way of input I/P to control logic 406. In response to such inputs, control logic 406 can execute predetermined functions on one or more CAM arrays 405, resulting output data can be output from control logic 406 at output O/P.

A BIST section 404 can include a BIST generator 410, BIST checker 412, and can also utilize a test MUX 408. In a test mode, a BIST generator 410 can generate address values and corresponding data values for application to CAM array 405. Test output data generated in response to such tests can be provided to BIST checker 412. Within BIST checker 412, a BIST result checker 414 can determine if a tested CAM entry is defective or not. Addresses of defective CAM entries can be stored in fault first-in-first-out (FIFO) circuit 416. These fault address values can be output as part of a BIST operation to indicate where faults have been detected within CAM array 405. Such information can aid in implementing redundancy or other techniques in order to increase yields of such devices.

FIG. 5 is a block diagram representation of a conventional BIST generator and BIST checker, like that shown as 410 and 412, respectively, in FIG. 4. FIG. 5 shows a conventional BIST checker 510 that includes an algorithm selector 520, an address generator 522, and data generator 524. An algorithm selector 520 can control how addresses and data are generated by address generator 522 and data generator 524 when testing a device. Conventionally, in a given test, an address generator 522 can generate addresses starting with a lowest address and ending with a highest address, or run particular test patterns that cover all locations within such addresses.

Conventionally, a highest and lowest address can be "hard coded" values. That is, these values can be inherent in the circuit design and not programmable or otherwise changeable after the device has been manufactured. For example, in a 64K device (or 64K section of a device) such addresses (or less significant bits of an address) can be 0000(hex) and FFFF(hex).

Referring still to FIG. 5, a BIST checker 512 is shown to include a fault FIFO 516. A fault FIFO 516 can store addresses of locations within a CAM array that are determined to be faulty. Such addresses can be reported (i.e., output in some form) in a BIST operation. The number of storage locations within a fault FIFO is finite and preferably small in order to not consume valuable circuit area.

A drawback to a conventional arrangement like that of FIGS. 4 and 5 is shown in FIG. 6. FIG. 6 is a diagrammatic representation of the address space of a CAM device. The CAM device 600 includes a number of addresses ranging from 0000(hex) to FFFF(hex). CAM entries determined to be defective are indicated by solid rectangles. The example of FIG. 6 assumes that a fault FIFO has a depth of three (three storage locations).

FIG. 6 illustrates a result when the number of faulty addresses exceeds a fault FIFO depth. In such a case, a tested address range 602 starts at address 0000 and ends at address FFFF. Starting at address 0000, a fault FIFO can store (and hence report) three failing addresses 604. However, because a FIFO is filled after that point, a fourth and all subsequent failing addresses will be "non-detected faults" 606. Thus, in order to acquire all faulty locations, a BIST operation must be abandoned or supplemented by a full array test on automatic test equipment (ATE). This can increase test time and cost.

DETAILED DESCRIPTION

Various embodiments of the present invention will now be described in detail with reference to a number of drawings. The embodiments show circuits and methods for built-in self test (BIST) in an integrated circuit device having addressable locations.

Figure 1:
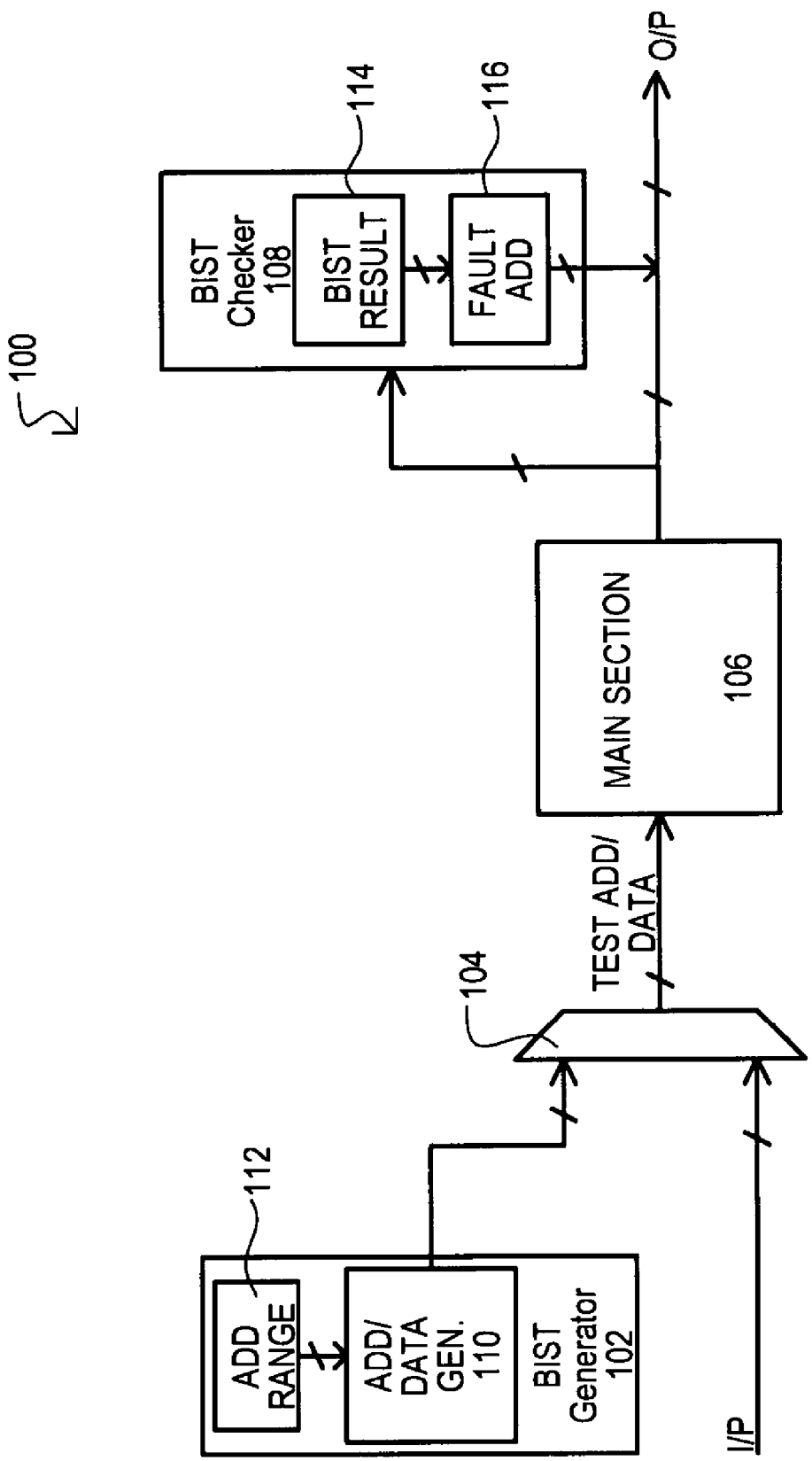
FIG. 1 is a block schematic diagram of an integrated circuit device having built-in self-test (BIST) capabilities according to one embodiment of the present invention.

An integrated circuit device according to a first embodiment is set forth in a block schematic diagram in FIG. 1 and designated by the general reference character 100. An integrated circuit 100 may be formed in a common substrate and/or a package for integrated circuits, and include a number of circuits sections. In the example of FIG. 1, an integrated circuit 100 can include a BIST generator 102, an input multiplexer 104, a main section 106, and a BIST checker 108.

A BIST generator 102 can provide test addresses and/or test data to test addressable locations within a main section 106. A BIST generator 102 can include an address/data generator 110 and an address range value circuit 112. Address/data generator 110 can generate a sequence of test addresses in a test mode. However, such addresses can be restricted to a predetermined test address range that is less than the total address range of main section 106 as determined by address range value circuit 112. Thus, portions of a total address range can be tested separately.

An input multiplexer 104 can input signals from device inputs (I/O) in a non-test mode, and can provide input signals from BIST generator 102 in a test mode.

A main section 106 can include a number of addressable locations, each accessed according to a unique address and testable with BIST generator 102 and BIST checker 108. Addressable locations within main section 106 are preferably memory locations, more preferably content addressable memory (CAM) locations, even more preferably CAM locations that include CAM memory cells, each of which includes compare circuits for comparing one or more stored bit values with corresponding search key (i.e., comparand) values. In a non-BIST mode, a main section 106 can generate output signals for destinations external to the integrated circuit device 100. In a very particular arrangement, such output signals can be generated in response to input signals received from sources external to the integrated circuit device 100. In a BIST operation, a main section 106 can receive test input data via input multiplexer 104. In response to such test input data, main section 106 can provide test output data to BIST checker 108.

A BIST checker 108 can include a BIST result circuit 114 and a fault address store 116. In a test mode, a BIST checker 108 can receive test output data from main section 106 indicating test results for addressable locations, and determine if each location is to be considered faulty. If a location is considered faulty, the address of the location can be stored in fault address store 116.

As noted above, in a BIST operation, according to address range value circuit 112, a predetermined address range can be tested within main section 106. Such a predetermined address range can be less than the total address range. In this way, a first address range can be tested, and fault data recorded and output. A next address range, different from the first address range can then be tested, and fault data recorded and output. This can be repeated until the total address range for main section 106 has been tested.

An address range value circuit 112 can determine a tested address range in a number of ways. Preferably, an address range value circuit 112 can store one or more programmable values that can divide a total address space of main section 106 into two or more parts. Even more preferably, a range value circuit 112 can store a programmable start address and programmable end address that can define a tested address range. In such an arrangement, a division of a total address range in a BIST operation can be flexible.

In this way, BIST operations can detect and identify all addresses for faulty locations in a tested circuit section, even when the number of overall faults exceeds the number of storage locations for recording such faults.

Figure 2:
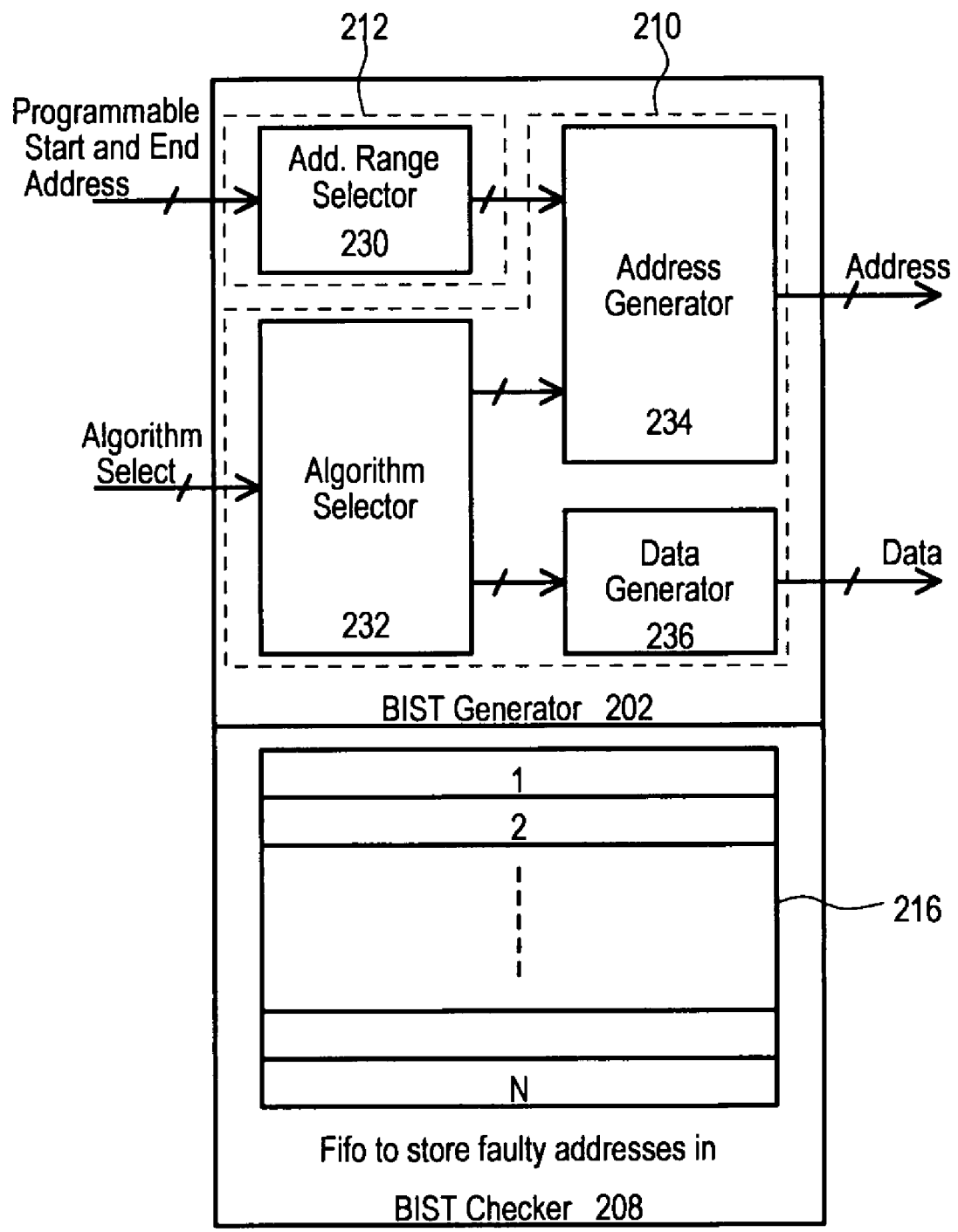
FIG. 2 is a block diagram showing an example of a BIST generator and a BIST checker that can be used in an embodiment like that of FIG. 1.

Referring now to FIG. 2, a block diagram shows an example of a BIST generator 202 and a BIST checker 208. In one very a particular embodiment, a BIST generator 202 can be used as a BIST generator shown as 102 in FIG. 1. Similarly, in a particular embodiment, a BIST checker 208 can be used as a BIST checker shown as 108 in FIG. 1.

In the particular example of FIG. 2, an address range value circuit 212 can include an address range selector circuit 230 and an address/data generator 210 can include an algorithm selector 232, an address generator 234, and a data generator 236. An address range selector circuit 230 can receive values that dictate a tested address range. In the example of FIG. 2, this includes programmable start and end addresses. Such programmable start and end addresses can be changed to define different test address ranges.

An algorithm selector 232 can receive an algorithm select value that determines which of a number of test algorithms is executed. An algorithm selector 232 can output control data to address generator 234 and data generator 236. Thus, in a test mode, address generator 234 and data generator 236 can output addresses and corresponding data according to a selected test algorithm. However, the range of addresses generated by address generator 234 can be restricted according to address range selector 230.

A BIST checker 208 can include, among other sections, a fault address store 216. In the example of FIG. 2, a fault address store 216 can include a first-in-first-out (FIFO) memory circuit having N storage locations. Accordingly, such a FIFO can store N faulty addresses. However, more than N faulty addresses can be detected by testing different address ranges, and outputting the faulty addresses for such different address ranges.

In this way, regardless of the depth of a fault address store, a total address range for a device can be tested.

Figure 3:
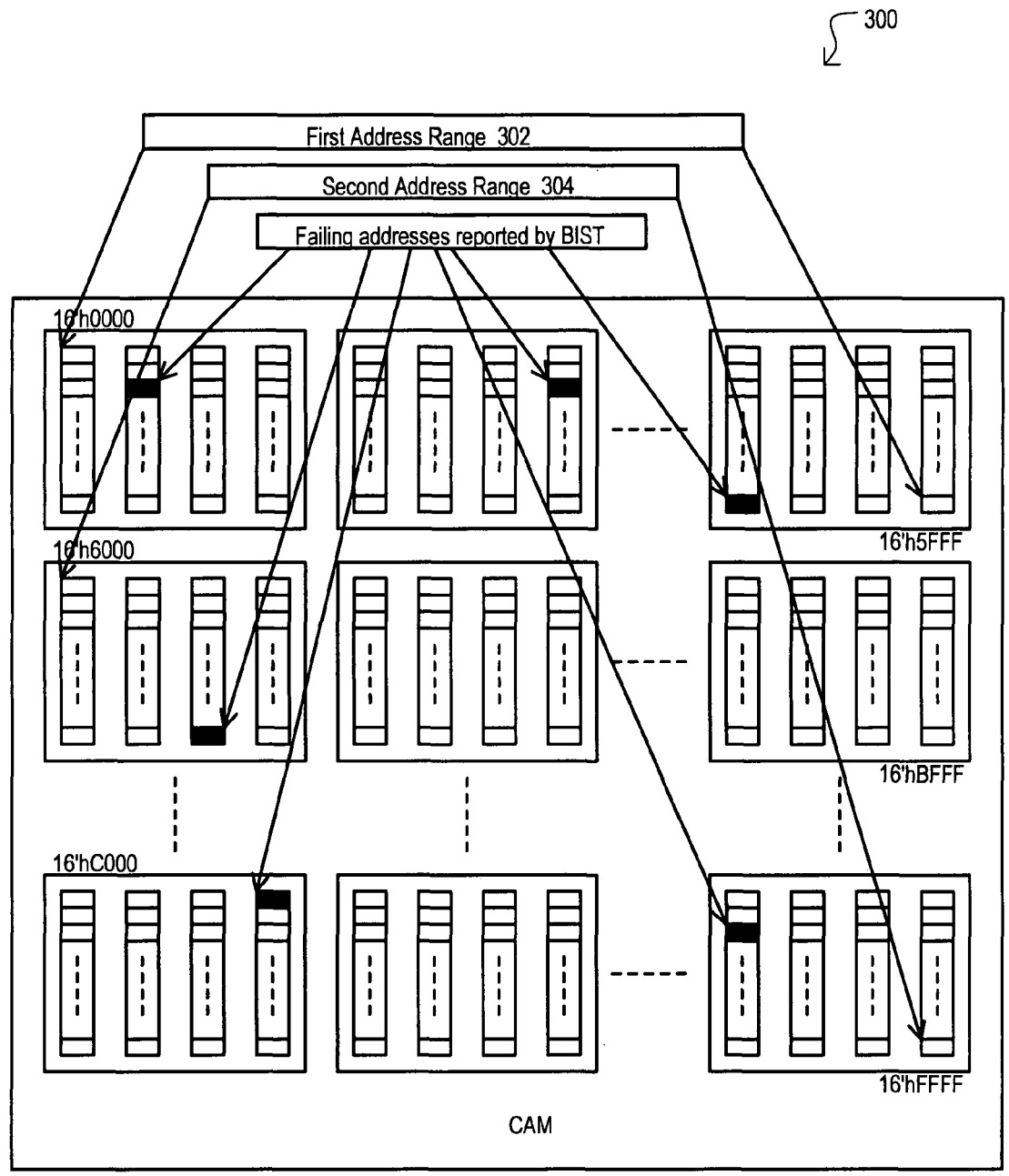
FIG. 3 is a diagrammatic representation of a BIST operation in a CAM device according to an embodiment of the present invention.
Figure 4:
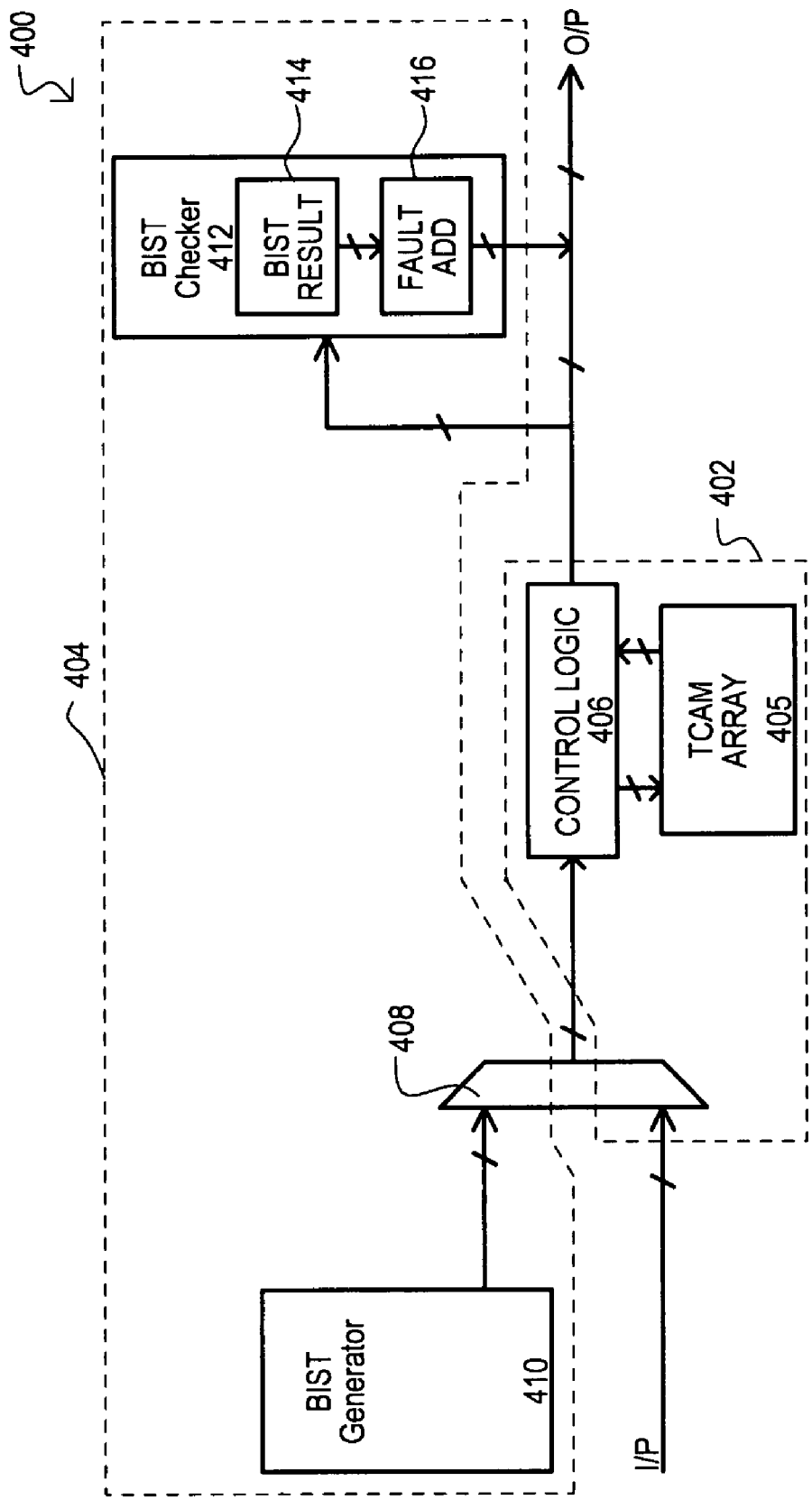
FIG. 4 is a block schematic diagram of a conventional BIST arrangement.
Figure 5:
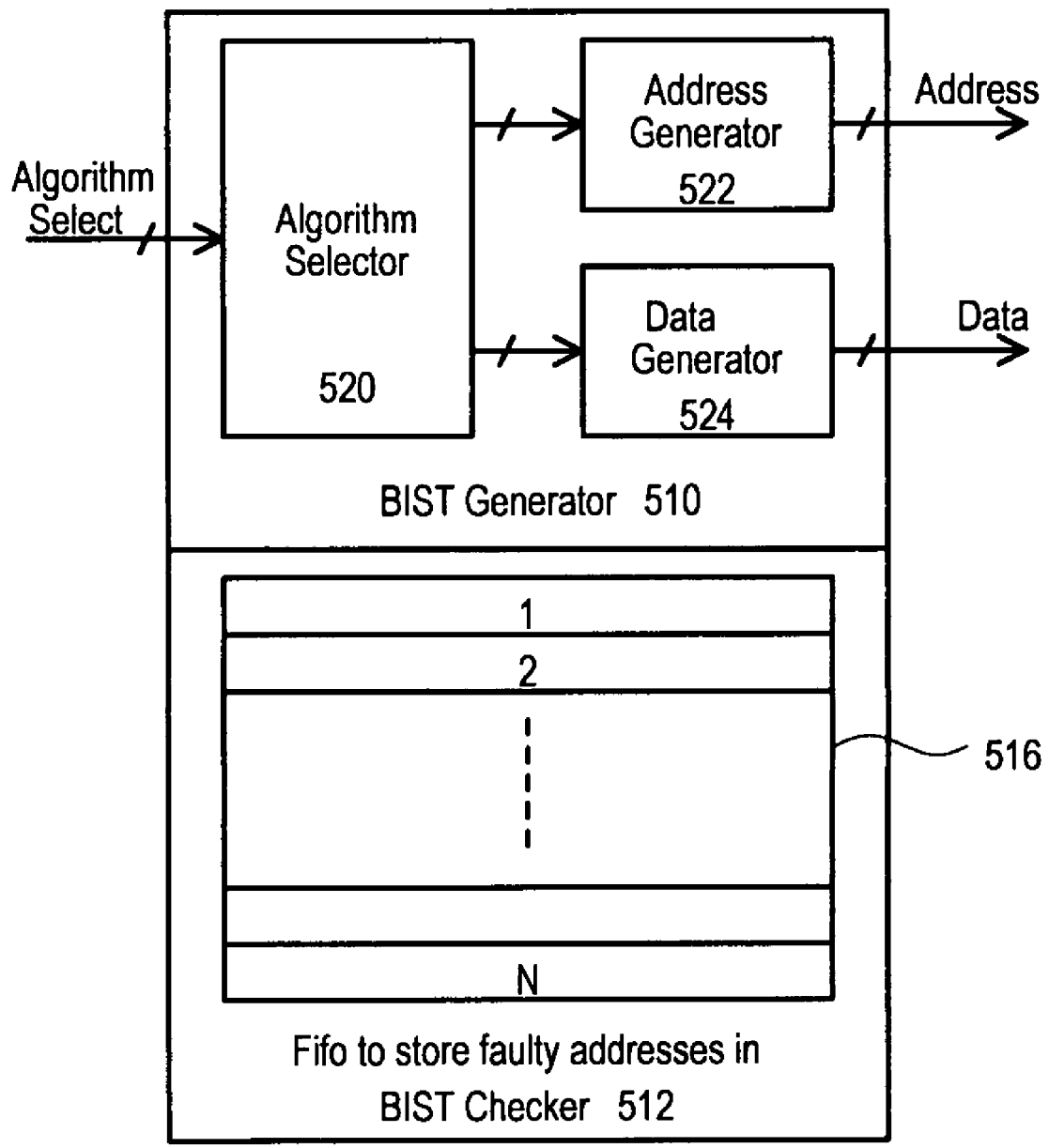
FIG. 5 is a block diagram representation of a conventional BIST generator and conventional BIST checker.
Figure 6:
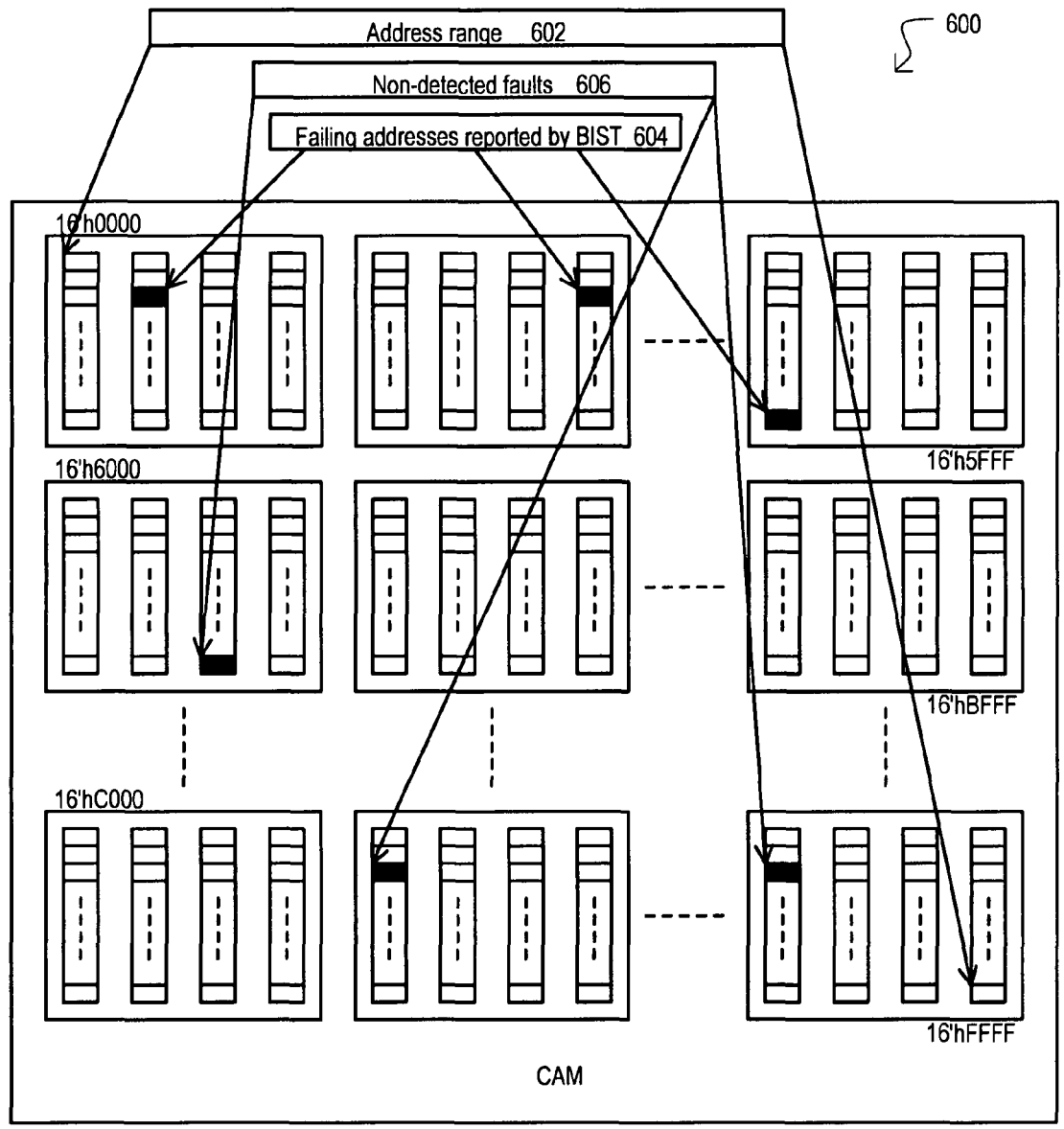
FIG. 6 is a diagrammatic representation of the address space of a conventional CAM device subject to a BIST operation.

Referring now to FIG. 3, a diagrammatic representation shows an address space of a CAM device tested according to the various embodiments. A CAM device 300 can include a number of addresses ranging from 0000(hex) to FFFF(hex). CAM entries determined to be defective are indicated by solid rectangles. The example of FIG. 3 assumes that a fault address store has a depth of three (three storage locations). Further, FIG. 3 includes the same defective addresses as FIG. 6 described above.

FIG. 3 illustrates a result that can occur when a BIST operation divides a total address space (0000(hex)-FFFF(hex)) into two tested address ranges. In particular, FIG. 3 shows a first tested address range 302 from 0000(hex) to 5FFF(hex) and a second address range 304 from 6000(hex) to FFFF(hex). As a result, a fault address store depth is not exceeded and all defective addresses can be recorded.

As but one example, referring back to FIG. 2, a first address range can be programmed by providing start address 0000(hex) and end address 5FFF(hex) to an address range selector 230. Address generator 234 and data generator 236 can output values according to a selected algorithm, however addresses will be bounded between 0000(hex) and 5FFF(hex). Resulting faulty addresses stored in fault address store 216 can be output. A second, different address range can then be programmed by providing start address 6000(hex) and end address FFFF(hex) to an address range selector 230. Address generator 234 and data generator 236 can output values according to the selected algorithm with addresses now bounded between 6000(hex) and FFFF(hex). A second set of resulting faulty addresses stored in fault address store 216 can be then output.

In this way, all faults can be detected regardless of fault address store depth in a BIST fashion. This can dispense with the need to test with automatic test equipment (ATE) in order to cover an entire address space.

It is understood that other embodiments can include additional features. For example, in one alternate embodiment, in a BIST operation that sequentially tests addressable locations, a fault address store (e.g., FIFO) can generate a flag when it is full. The next address following a last defective address can be stored and utilized as a start address for a next tested address range.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
a main section comprising a plurality of locations, each accessed according to a unique address;
an address range selector that provides at least one programmable address limit value;
a test address generator that generates a plurality of addresses in a test mode, the plurality of addresses being less than all the addresses of the main section and being defined according to the at least one programmable address limit value; and
a fault address store having a plurality of storage locations for storing addresses of faulty locations in the main section.

2. The integrated circuit device of claim 1, wherein:
the main section comprises a content addressable memory (CAM) device comprising a plurality of CAM locations, each for storing a data value for comparison to a search key.

3. The integrated circuit device circuit of claim 2, wherein:
each CAM location comprises a plurality of CAM cells having compare circuitry for comparing at least one search key bit to a stored data bit.

4. The integrated circuit device circuit of claim 1, wherein:
the address range selector provides a low limit address and a high limit address; and
the test address generator generates test addresses having a range established by a low limit address and a high limit address.

5. The integrated circuit device of claim 1, wherein: the fault address store comprises a first-in-first-out (FIFO) memory circuit.

6. The integrated circuit device of claim 5, wherein:
the number of locations in the main section is no less than 32 k (32×1024); and
the number of storage locations in the fault address store is no more than eight.

7. An integrated circuit device, comprising:
a tested circuit comprising a plurality of addressable locations covering a total address range;
a range setting circuit that stores at least one programmable address corresponding to one of the addressable locations;
an address generator that generates a sequence of test addresses covering a test address range of addresses in a test mode, the test address range covering less than the total address range; and
a fault address store, comprising a first-in-first-out (FIFO) circuit, that stores addresses of addressable locations determined to be faulty in response to the application of at least a test address to access an addressable location.

8. The integrated circuit device of claim 7, wherein:
the at least one programmable address includes a start address and an end address; and
the test address range is defined by the start address and end address.

9. The integrated circuit device of claim 7, further including:
a data generator that outputs test data in parallel to test addresses in the test mode.

10. The integrated circuit device claim 9, further including:
a test algorithm selector coupled to the address generator that determines at least the order of test addresses of the test address range in the test mode.

11. The integrated circuit device claim 7, wherein:
the tested circuit comprises a circuit selected from the group consisting of: a binary content addressable memory (CAM) array, a ternary CAM array, and a pseudo-ternary CAM array.

12. A method of self-testing an integrated circuit, comprising:
(a) storing at least one address range value;
(b) accessing a plurality of storage locations of a tested portion of the integrated circuit (IC) according to a range of test addresses determined by the at least one address range value, the range of test addresses being less than all storage locations of the tested portion; and
(c) storing the address of storage locations within the range of test addresses determined to be faulty by at least the application of a test address.

13. The method of claim 12, wherein:
storing at least one range address value includes storing a start address and an end address; and
the range of test addresses is bounded by the start address and end address.

14. The method of claim 12, further including:
outputting the addresses of faulty locations; and
repeating steps (a) through (c) with a different at least one address range value.

15. The method of claim 14, wherein:
repeating step (c) includes
accessing a second plurality of storage locations of the tested portion of the IC according to a second range of test addresses that does not overlap the previous range of test addresses.

16. The method of claim 12, wherein:
accessing the plurality of storage locations includes accessing entries of a content addressable memory (CAM) array, each of which stores a data value for comparison to a search key value.

17. The method of claim 16, wherein:
each CAM entry comprises a plurality of CAM cells, each of which compares at least one stored bit value to a search key value.

* * * * *